United States Patent
Guha et al.

[11] Patent Number: 5,273,587
[45] Date of Patent: Dec. 28, 1993

[54] IGNITER FOR MICROWAVE ENERGIZED PLASMA PROCESSING APPARATUS

[75] Inventors: Subhendu Guha, Troy; Arindam Banerjee, Madison Heights, both of Mich.

[73] Assignee: United Solar Systems Corporation, Troy, Mich.

[21] Appl. No.: 941,163

[22] Filed: Sep. 4, 1992

[51] Int. Cl.$^5$ .................. C23C 16/50; H01L 21/00
[52] U.S. Cl. ............ 118/723 MW; 118/723 ME; 118/715; 156/345; 315/111.21; 204/298.38
[58] Field of Search ............ 118/723, 715, 719; 156/345; 315/111.21; 204/298.33, 298.38

[56] References Cited

U.S. PATENT DOCUMENTS

| | | | |
|---|---|---|---|
| 4,507,588 | 3/1985 | Asmussen et al. | 315/39 |
| 4,609,808 | 9/1986 | Bloyet et al. | 219/212 PR |
| 4,673,456 | 6/1987 | Spencer et al. | 156/345 |
| 4,691,662 | 9/1987 | Roppel et al. | 118/723 X |
| 4,785,763 | 11/1988 | Saitoh | 118/723 |
| 4,888,088 | 12/1989 | Slomowitz | 156/643 |
| 4,965,540 | 10/1990 | Sullivan | 333/227 |
| 4,986,214 | 1/1991 | Zumoto et al. | 118/723 XR |
| 5,024,182 | 6/1991 | Kobayashi et al. | 118/723 |

Primary Examiner—Brian E. Hearn
Assistant Examiner—Jonathan D. Baskin
Attorney, Agent, or Firm—Krass & Young

[57] ABSTRACT

An igniter for a plasma processing apparatus comprises a hollow, at least partially microwave transmissive, body having a gas inlet and gas outlet passing therethrough. The geometry of the inlet and outlet are selected so that the outlet provides a greater impedance to gas flow than does the inlet. In this manner, there is provided a high pressure region in the igniter in which plasma ignition is facilitated. Ionized species generated in the igniter function to initiate plasma formation externally of the igniter.

8 Claims, 2 Drawing Sheets

1

IGNITER FOR MICROWAVE ENERGIZED PLASMA PROCESSING APPARATUS

FIELD OF THE INVENTION

This invention relates generally to microwave energized, plasma processing apparatus. More specifically, the invention relates to an igniter for initiating the formation of a plasma in a microwave energized, plasma processing apparatus.

BACKGROUND OF THE INVENTION

Plasma processing apparatus are widely used for coating, etching or otherwise treating a variety of materials. Such apparatus are widely used in the manufacture of semiconductor devices and have particular applicability for the deposition of thin film electronic materials.

In a typical plasma process, electromagnetic energy is absorbed by a gas which is usually maintained at subatmospheric pressure. The electromagnetic energy ionizes the gas and creates a plasma therefrom. The plasma provides a highly reactive chemical environment which may be utilized to etch, oxidize or nitride a workpiece; or to deposit a variety of materials. Microwave energized plasma processes are being increasingly employed because the highly reactive environment created by the microwaves provides for the rapid and economical processing of a variety of materials. Within the context of this application "microwave energized plasma processing apparatus" shall include all systems in which microwave energy generates a plasma which is employed to treat a workpiece, deposit a material or otherwise facilitate a chemical reaction.

Ignition (also termed initiation) of the plasma is particularly important in microwave energized processes. A body of unionized gas disposed in the plasma apparatus is electrically insulating and in most instances will be a very poor absorber of microwave energy; in contrast, an ionized body of gas is electrically conductive and is a very good absorber of microwave energy. As a result, initiation of the plasma is typically difficult and requires very high levels of microwave power relative to the level of power required to sustain the plasma. This situation can present significant problems since the chamber with the unionized gas represents a non-resonant, reactive load and as such can reflect a great deal of the microwave power back to the microwave source thus damaging it. Additionally, the change in impedance once plasma is initiated will require an adjustment of power level, thereby complicating the control system of the apparatus.

The problem of plasma ignition in microwave energized apparatus has been recognized in the art and various approaches thereto have been implemented. As noted above, the level of power applied to the system may be switched from a high, ignition level to a lower operating level; although, as noted, this approach does not solve problems of reflected power and requires complicated control circuitry. Another approach to the problem is to pre-ionize the atmosphere in the plasma chamber, and as noted in U.S. Pat. No. 4,888,088, ionization may be initiated by use of an auxiliary set of radio frequency energized electrodes. As disclosed in U.S. Pat. No. 4,609,808, a high voltage spark may be employed to begin ionization of the gas. A similar approach is presented in U.S. Pat. No. 4,965,540 wherein a high voltage, high frequency tesla coil is coupled to an igniter wire which is disposed in the plasma chamber. Another approach has been to use ultraviolet light for purposes of initiating ionization and U.S. Pat. No. 4,673,456 discloses one such system.

It has been found that the power level for ignition of a microwave energized plasma is to some degree proportional to the pressure of the gas in the chamber, and ignition of plasma is generally easier at a higher pressure than at a lower pressure. U.S. Pat. No. 4,507,588 discloses a microwave plasma system wherein plasma ignition takes place at a pressure of approximately 300 microns while operation of the system occurs at a substantially lower pressure of $10^{-4}$ torr.

While various systems and methodologies have been implemented in the prior art to ignite a microwave energized plasma, it will be appreciated that the prior art approaches all necessitate additional steps in the operating cycle of the equipment and/or complicated hardware. For example, ionization must be separately initiated by activating spark coils, lamps, auxiliary electrodes and the like; or, power levels and/or pressure levels must be varied during the start-up of the equipment. Clearly, there is a need for a means for initiating a microwave plasma which does not necessitate significant changes in the operational parameters of the equipment and which avoids the need for incorporating complex auxiliary hardware into the system.

The present invention provides an igniter for a microwave energized plasma apparatus, which need not be separately controlled, either during the start-up or operational phase of the plasma equipment. The igniter of the present invention is simple in operation and may be readily retrofitted into present plasma systems. These and other advantages of the present invention will be readily apparent from the drawings, discussion and description which follow.

BRIEF DESCRIPTION OF THE INVENTION

There is disclosed herein a microwave energized plasma processing apparatus which includes a processing chamber that is sealable from an ambient environment and is capable of sustaining a subatmosphere pressure therein and which has a plasma region defined therein. A pumping system is in communication with the processing chamber and is operative to provide a subatmospheric pressure in the chamber. A process gas supply is also in communication with the processing chamber and operates to introduce a process gas into the plasma region of the chamber. A source of microwave energy is in communication with the chamber and operates to introduce microwave energy into the plasma region so as to create a plasma from the process gas. In accord with the present invention, the apparatus further includes a plasma igniter disposed in the plasma region. The plasma igniter comprises an ignition body which is at least partially formed from a microwave transparent material and which encloses an interior volume. The igniter includes a gas inlet for introducing a gas into the ignition body and gas outlet in communication with the interior of the processing chamber. The inlet and outlet of the igniter are configured so that the outlet provides a greater impedance to gas flow than does the inlet so that the gas pressure within the ignition body is higher than it is in the processing chamber when a gas is flowing through the igniter. In some embodiments, the gas inlet of the plasma igniter is in operative communication with the process gas supply so that at least a portion of the process gas flows therethrough. In other instances, the plasma igniter is in communication with a source gas separate from the process gas supply. This separate source may comprise a source of a gas substantially similar to the process gas or it may comprise a source of a gas different from the process gas. The microwave transparent material of the igniter body may comprise a ceramic material or quartz.

DETAILED DESCRIPTION OF THE PREFERRED EMBODIMENT

Figure 1:
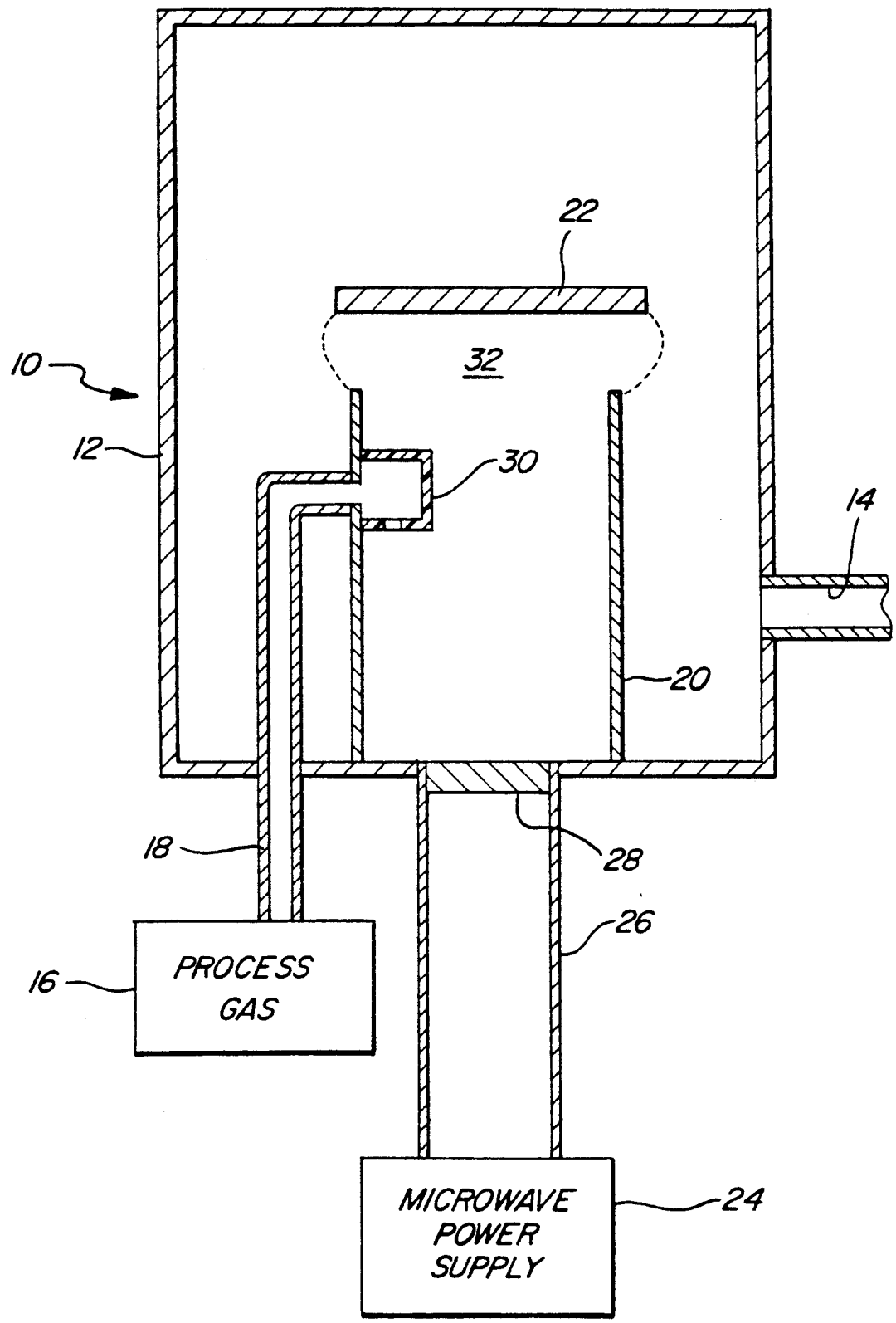
FIG. 1 is a cross-sectional view of a stylized, microwave energized, processing system incorporating the igniter of the present invention.

Referring now to FIG. 1 there is shown a schematic view of a microwave energized, glow discharge apparatus 10. In the context of the present disclosure, the apparatus 10 will be described with particular reference to a system for the microwave energized glow discharge deposition of a layer of thin film semiconductor material onto a substrate, although it is to be understood that the apparatus could similarly be operative for etching or otherwise treating a substrate or for carrying out any other type of plasma process such as vapor phase reactions, incinerations and the like.

The apparatus 10 of FIG. 1 includes a processing chamber 12 which is capable of sustaining a subatmospheric pressure therein and which is sealable from the ambient atmosphere. The chamber includes an evacuation conduit 14 which is in operative communication with a pumping system (not shown). The apparatus 10 also includes a source 16 of process gas in communication with the interior of the chamber 12 via a process gas conduit 18. The source 16 of process gas may comprise a manifolded series of gas cylinders or similar containers operative to provide a controlled deposition atmosphere within the chamber 12. The nature of the process gases and the gas supply 16 will depend upon the particular operations carried out within the chamber. By control of the flow of process gas through the process gas conduit and the rate of evacuation of the chamber 12 via the evacuation conduit 14, the pressure within the chamber 12 may be controlled. Also disclosed within the chamber 12 is a shield 20 which functions to define a subchamber region therewithin. It is to be noted that the process gas conduit 18 communicates with the shield 20 to introduce the process gas thereinto.

The apparatus further includes a microwave power supply 24 having a wave guide 26 coupled thereto. The power supply-waveguide combination communicates with the deposition chamber 12 via a microwave transmissive window 28, as is well known to those of skill in the art. The window 28 permits passage of microwaves from the ambient atmosphere in the waveguide 26 into the deposition chamber 12. As depicted in this embodiment, the window is disposed to introduce the microwaves into the subchamber region defined by the shield 20.

Also disposed within the chamber is a substrate 22, which, in this instance, is the workpiece upon which deposition occurs. There is defined within the deposition chamber 12 a plasma region 32, as bounded by the substrate 22, the shield 20 and the dashed lines therebetween. It is in this plasma region 32 that the microwave energy introduced from the power supply 24 ionizes the process gas and creates an energetic plasma therefrom.

In accord with the principles of the present invention, the system 10 of FIG. 1 further includes a plasma igniter 30 disposed in the plasma region 32 of the chamber 12. The igniter is shown in better details in FIGS. 3A and 3B and, as will be seen therefrom, it comprises an ignition body 34 which is fabricated from a microwave transmissive material such as quartz, ceramic, glass, polymer and the like, and it encloses an interior volume 36. The igniter 30 further includes a gas inlet 38 for introducing a gas into the interior volume 36 of the ignition body 34 and a gas outlet 40 which is in communication with the interior of the deposition chamber 12 and with the interior volume 36 of the ignition body 34. The geometry of the gas inlet 38 and gas outlet 40 are selected so that the outlet 40 provides a greater impedance to gas flow than does the inlet. This creates an effective bottleneck in the gas flow path so as to provide a higher gas pressure within the interior volume 36 of the ignition body as compared to the chamber 12.

As noted above, the ignition body is at least partially microwave transparent; therefore, microwaves may enter and excite a plasma therein. The fact that the gas pressure is higher within the ignition chamber facilitates ignition of the plasma therein while at the same time, a lower operating pressure can be maintained within the deposition chamber itself. Excited species formed within the ignition body 34 exit through the gas outlet 40 and serve to nucleate further plasma formation within a plasma region 32 of the chamber 12.

Figure 3A:
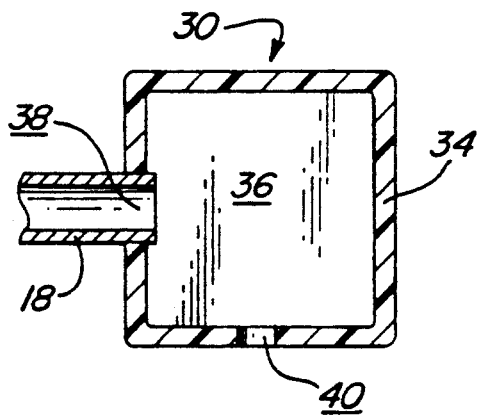
FIG. 3A is an enlarged, cross-sectional view of one embodiment of igniter of the present invention.
Figure 3B:
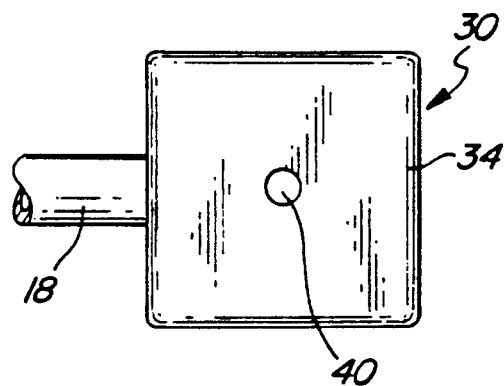
FIG. 3B is a bottom plan view of the igniter of FIG. 3A.

FIG. 3B presents a bottom plan view of the igniter 30 of FIG. 3A. Visible in the drawing is the bottom of the igniter body 34 as well as the gas outlet 40 and a portion of the process gas conduit 18 which enters the igniter 30. It will be appreciated that other configurations of igniter 30 may be employed in connection with the present invention. For example, the igniter body may be configured as a cylinder, a sphere or any other such shape. Likewise, the geometry of the inlet and outlet may be varied. For example, the outlet may comprise a series of openings and such openings may be disposed on a number of different faces of the igniter body provided the impedance of gas flow is such that a back pressure is maintained therewithin. The only limitations upon the material of the igniter body are that it be at least partially transparent to microwave energy and that it be compatible with conditions encountered in the processing chamber. Ceramic materials are particularly preferred for this application. In other instances, glass, quartz, polymers and similar materials may be employed.

It will thus be seen that the igniter of the present invention provides a relatively small, high pressure region within the main plasma region of a microwave energized plasma processing apparatus for purposes of initiating plasma formation. Ionic species generated therein initiate plasma formation in the main portion of the processing chamber. The present invention eliminates the need to vary power levels or pressures within the chamber during operation of the system, and it voids the need for separate electrode systems, tesla coils, excitory lamps and the like.

As depicted in the FIG. 1 embodiment, the entirety of the process gas flows from the process gas supply 16, through the conduit 18, through the igniter 30 and into the plasma region 32 of the chamber 12. In some instances it may be desirable to flow only a portion of the process gas through the igniter 30 and to supply the remainder of the process gas through a separate conduit. In other instances, the igniter is provided with a supply of a gas separate from the process gas.

Figure 2:
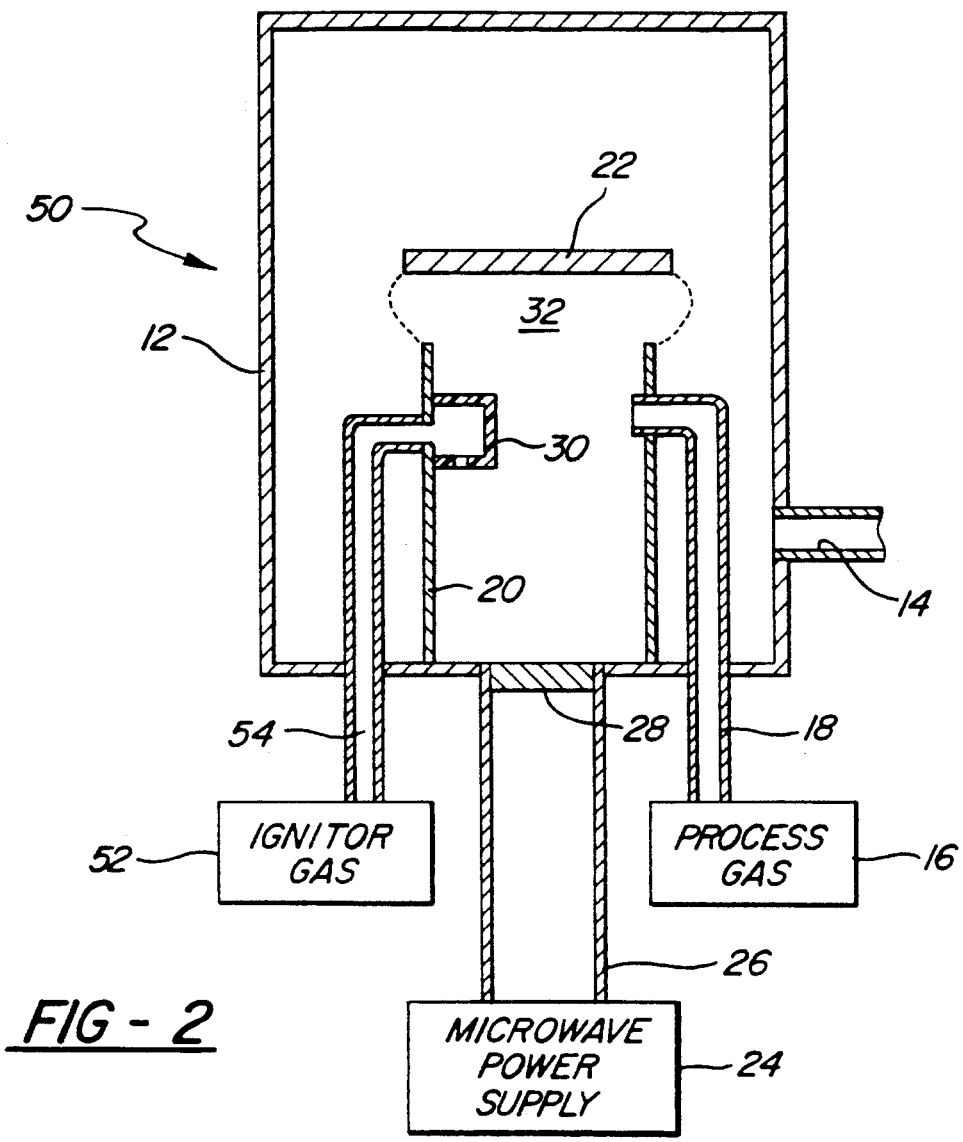
FIG. 2 is a cross-sectional view of a stylized, microwave energized, processing system including another embodiment of igniter structured in accord with the present invention.

Referring now to FIG. 2 there is shown an alternative embodiment of plasma processing apparatus 50 structured in accord with the principles of the present invention. In this figure, like elements will be referred to by the same figure numbers as in the foregoing drawings. The apparatus 50 includes a chamber 12, evacuation conduit 14, power supply 24, waveguide 26 and microwave transmissive window 28 as previously described. Disposed within the chamber 12 is substrate 22 and a plasma region 32 is defined therein, all as previously described.

The apparatus 50 of FIG. 2 differs from that of FIG. 1 in that the process gas supply 16 communicates with the plasma region 32 via the process gas conduit 18 directly, and the plasma igniter 30 is in communication with an igniter gas supply 52 via an igniter conduit 54. The igniter gas may be identical to the process gas, or it may differ therefrom. In some instances, the igniter gas may include a species which is more readily ionized than is the process gas so as to further facilitate plasma initiation. For example, the igniter gas may comprise, or include a readily ionizable gas such as xenon. Although not illustrated, the apparatus may further include a shut-off valve associated with the igniter gas conduit 54 to terminate the flow of igniter gas once plasma is initiated and the system is operational.

It should be appreciated that the principles of the present invention may be incorporated into any plasma system wherein a plasma is formed in a body of gas disposed therein. As such, the invention may be employed in combination with etching systems, deposition systems, cleaning systems, oxidizing systems, nitriding systems and the like. While the invention has been described herein in combination with apparatus which includes a shield to define a subchamber region therein, this feature is not critical to the operation of the present invention. In many systems, a plasma region is simply defined about a workpiece by a flow of process gas therethrough and by the distribution of microwave energy therein. Therefore, the plasma region may be regarded as that portion of the chamber in which the excited plasma is found and as such may comprise all, or a portion of the chamber.

In view of the foregoing it is to be appreciated that numerous variations and modifications of the present invention may be practiced in keeping with the spirit thereof. The foregoing drawings, discussion and description are merely meant to illustrate particular embodiments of the invention and are not meant to be limitations upon the practice thereof. It is the following claims, including all equivalents, which define the scope of the invention.

We claim:

1. A microwave energized glow discharge apparatus comprising:
   a processing chamber which is sealable from an ambient environment and which is capable of sustaining a subatmospheric pressure therein, said chamber having a plasma region defined therein;
   a pumping system disposed in communication with the processing chamber and being operative to provide a subatmospheric pressure therein;
   a process gas supply, in communication with the processing chamber, for introducing a process gas into the plasma region thereof;
   a plasma igniter disposed in the plasma region, said plasma igniter comprising an ignition body at least partially formed from a microwave transparent material and enclosing an interior volume which is smaller than the volume of said plasma region, said igniter further including a gas inlet for introducing a gas into the ignition body, and a gas outlet in communication with a main plasma region of the processing chamber outside said interior volume, to introduce thereinto excited species of said gas formed within the ignition body to nucleate further plasma formation within said main plasma region, said inlet and outlet being configured so that the outlet provides a greater impedance to gas flow than does the inlet so that gas pressure within the ignition body is higher than in the processing chamber when a gas is flowing through the igniter, so that the interior volume of said igniter provides a high pressure region in said main plasma region, and;
   a source of microwave energy in communication with the chamber for introducing microwave energy into both the interior volume of the igniter and the main plasma region.

2. An apparatus as in claim 1, wherein the gas inlet of said plasma igniter is in operative communication with the process gas supply so that at least a portion of said process gas flows therethrough.

3. An apparatus as in claim 2, wherein substantially all of said process gas flows through said plasma igniter.

4. An apparatus as in claim 1, wherein the gas inlet of said plasma igniter is in communication with a source of gas separate from said process gas supply.

5. An apparatus as in claim 4, wherein said source of gas is a source of a gas including at least one component which has a lower ionization potential than does any component of said process gas.

6. An apparatus as in claim wherein said source of gas is a source of a gas including at least one component of said process gas.

7. An apparatus as in claim 1, wherein said microwave transparent material comprises a ceramic.

8. An apparatus as in claim 1, wherein said microwave transparent material comprises quartz.

* * * * *

UNITED STATES PATENT AND TRADEMARK OFFICE
CERTIFICATE OF CORRECTION

PATENT NO. : 5,273,587
DATED : December 28, 1993
INVENTOR(S) : Guha, Subhendu, et al It is certified that error appears in the above-indentified patent and that said Letters Patent is hereby corrected as shown below:

In Claim 6, column 6, line 54 of the Patent, after the word "Claim" insert --4,--.

Signed and Sealed this

Thirty-first Day of May, 1994

Attest:

BRUCE LEHMAN

Attesting Officer

Commissioner of Patents and Trademarks